United States Patent [19]
Smit et al.

[11] Patent Number: 6,151,238
[45] Date of Patent: Nov. 21, 2000

[54] CALIBRATING FUNCTIONS OF AN INTEGRATED CIRCUIT AND STORING CALIBRATION PARAMETERS THEREOF IN A PROGRAMMABLE FUSE ARRAY

[75] Inventors: Willem Smit, Chandler; Paul Hofhine, Mesa; Clark Rogers, Phoenix, all of Ariz.

[73] Assignee: Microchip Technology, Inc., Chandler, Ariz.

[21] Appl. No.: 09/256,598

[22] Filed: Feb. 23, 1999

[51] Int. Cl.[7] ................................................. G11C 17/00
[52] U.S. Cl. ............................................ 365/96; 365/225.7
[58] Field of Search ................................... 365/96, 225.7; 713/1; 714/3

[56] References Cited

U.S. PATENT DOCUMENTS

| | | | |
|---|---|---|---|
| 5,384,847 | 1/1995 | Hendrickson et al. | 380/247 |
| 5,440,513 | 8/1995 | Smith | 365/190 |
| 5,504,903 | 4/1996 | Chen et al. | 713/1 |
| 5,590,273 | 12/1996 | Balbinot | 714/3 |
| 5,598,122 | 1/1997 | McClure | 327/538 |

*Primary Examiner*—David Nelms
*Assistant Examiner*—Gene N. Auduong
*Attorney, Agent, or Firm*—Baker Botts L.L.P.

[57] ABSTRACT

An integrated circuit having a microcontroller, mask programmed read only memory, functions such as clock oscillator, analog-to-digital converter, timers, etc., where each may be adjusted with a digital input to a desired calibration value. The digital input resulting in the desired calibration value being stored in a programmable fuse array.

32 Claims, 5 Drawing Sheets

CALIBRATING FUNCTIONS OF AN INTEGRATED CIRCUIT AND STORING CALIBRATION PARAMETERS THEREOF IN A PROGRAMMABLE FUSE ARRAY

BACKGROUND OF THE INVENTION

This invention relates generally to semiconductor integrated circuits having post manufacture calibration of internal functions, and more particularly, to integrated circuits using a programmable fuse array for storing calibration information for the internal functions.

DESCRIPTION OF THE RELATED TECHNOLOGY

A microcontroller of an integrated circuit typically is controlled by software instructions contained in programs which may be stored in read only memory (ROM) that may be contained on the integrated circuit. The program instructions in the ROM may be created during the mask and photolithography process of manufacturing the integrated circuit die, or the ROM program installed after the manufacturing process using electrically programmable ROM such as, for example, electrically programmable ROM (EPROM), electrically erasable and programmable ROM (EEPROM) and the like. The mask programmed ROM is the most cost effective, however, since fewer processing steps are required to manufacture and any type of post manufacture programming requires additional circuitry and steps in programming. Programs stored in the ROM are typically referred to as firmware.

Many types of integrated circuits have an internal components having parameters which may be varied for calibration purposes. These internal components may be, for example, current sources, resistance-capacitance (RC) timing circuits in an oscillator used for generating clock pulses for use by logic functions within the integrated circuit, e.g., the microcontroller, shift registers and the like. In order to attain optimal performance of the integrated circuit, the internal RC oscillator preferably is calibrated or trimmed to a predetermined frequency. Other functions which are internal to an integrated circuit and which preferably require calibration include analog-to-digital or digital-to-analog conversion, bandgap reference voltage generation, thermistor temperature sensing, and watchdog timer. There may be other functions, beyond those named above, also requiring calibration and/or trimming to a desired value.

The prior art accomplished frequency calibration by laser trimming the timing component(s) after completion of manufacture of the mask layers. Laser trimming is an expensive process which changes the value of the resistor(s) and/or the capacitor(s) in the RC timing circuit to achieve a desired frequency. Another limitation of laser trimming is that it must be done prior to final assembly of the integrated circuit die into a packaged integrated circuit. Thus, calibration was not possible after final assembly of components in a system or later in field applications.

Another possible solution of calibrating internal references in the integrated circuit is to use an adjustment or offset table having digital offset or compensation values stored therein. These digital offset or compensation values may be used for correcting the actual values of the internal functions of the integrated circuit, e.g., frequency, temperature range, voltage and current. However, these digital offset or compensation values do not alter the actual internal reference value(s), but rather they alter, offset or bias the reference value(s) to a desired end use reference value(s). This technique is much like wearing glasses to correct poor vision.

Providing PROM on an integrated circuit allows for programming the device after fabrication and encapsulation into a package is complete. There are various types of PROM which include, but are not limited to, simple PROM (i.e. write once), EPROM (UV erasable) and EEPROM (electrically erasable). However using PROM generally requires that both the program memory and the calibration data be stored in this PROM. An example of using PROM for digital calibration compensation is disclosed in commonly owned U.S. Pat. No. 5,619,430 by Nolan et al., (hereinafter "Nolan"). Nolan discloses the incorporation of "EPROM user space" for storing calibration data. The result of the Nolan implementation is that calibration data is calculated and stored in EPROM during a post-manufacturing procedure such as a test sequence or in the field upon application of the integrated circuit.

All of the various PROM alternatives discussed above add complexity and cost to the integrated circuit as compared to the mask programmed ROM based integrated circuit. Furthermore, in many applications, the ability to program the device during a post-manufacturing procedure is not required. Thus, by having to replace the low cost ROM with the higher cost PROM for both program memory and the calibration data storage, the cost and complexity of the integrated circuit are increased in the absence of a corresponding overall requirement to do so.

Therefore, what is needed is a more cost effective, simple and reliable system, method and apparatus for storing calibration information for the adjustment of internal functions without the limitations imposed by laser trimming, or requiring complex and expensive PROM.

SUMMARY OF THE INVENTION

The invention overcomes the above-identified problems as well as other shortcomings and deficiencies of existing technologies by providing in a single integrated circuit a programmable fuse array for storing calibration information used to adjust internal functions of the integrated circuit. This calibration information may be used to calibrate the internal functions of the integrated circuit to desired values for best operation thereof. In addition, the invention allows calibration of the internal functions and/or references after manufacture and assembly of a system utilizing the integrated circuit. The most efficient and cost effective use of mask programmed ROM firmware programs, for controlling a microcontroller in the integrated circuit, may be utilized with the present invention without affecting its post manufacture capabilities of storing the calibration information used to adjust the critical internal functions of the integrated circuit.

In accordance with an embodiment of the present invention, an integrated circuit comprises at least one internal function having a plurality of components which determine a parameter value of the function, and a programmable fuse array for storing calibration information associated with the plurality of components so as to achieve the desired parameter value. In addition, the present invention may easily be integrated with a microcontroller and mask programmed ROM on the same integrated circuit die. The present invention, in combination with a microcontroller and ROM on the integrated circuit die, achieves a low cost but sophisticated product which may be used in critical and precision applications that require calibration after manufacture of the individual functions of the system, and heretofore could only be implemented with more costly externally adjustable discrete components and/or post manufacture programmed RAM, or PROM (EPROM, EEPROM and the like).

The present invention utilizes a programmable fuse array comprising a plurality of conductive fuse links made of metal, polysilicon and the like, fabricated on the integrated circuit die during manufacture thereof. This programmable fuse array stores the calibration information which is used to add and/or remove components associated with the function to achieve the desired parameter value obtained during calibration of the system. For example, an internal RC oscillator may be used to generate clock pulses for the integrated circuit microcontroller. The frequency of the RC oscillator may be adjusted by changing the value of a timing resistor or capacitor. In the prior art, laser trimming or an external adjustable component had to be utilized for precise calibration to a desired frequency. In the present invention, blowing one or more of the fuse links of the programmable fuse array stores a digital value which may be used to add or remove a portion of the timing capacitor or resistor, thus adjusting the frequency of the RC oscillator to the desired calibration value.

Another example of the embodiment of the invention is to store calibration information for calibration of an internal voltage reference value. The calibration of the internal voltage reference value may be obtained by adding or subtracting portions of a resistive voltage divider so as to adjust the reference voltage.

Still another example is storing calibration information for adding or subtracting portions of resistance or capacitance values to change the offset voltage or frequency response of an analog amplifier without requiring external components. Similarly, the gain of an operational amplifier may be adjusted without requiring external components thereto. In addition, the pulse width of a one-shot monostable may be precisely set without requiring external components.

In another embodiment of the invention, the programmable fuse array may be on a separate integrated circuit from the integrated circuit comprising the microprocessor, ROM and function(s). This allows subsequent modification to the function parameters without having to replace the more expensive integrated circuit containing the microprocessor, ROM and function(s). Thus, reuse and recalibration of the system utilizing the invention is easily and cost effectively achieved.

An advantage of the present invention is that external components are not required for post manufacture or field adjustment of critical parameters within the integrated circuit.

Another advantage is lower cost implementation of integrated circuits requiring precision timing and/or voltage calibrated parameter values.

Still another advantage is an integrated circuit utilizing lower cost mask programmable ROM, yet having the capability of precision adjustment of critical on chip circuit parameters.

Yet another advantage is ease and low cost of manufacture of integrated circuits having adjustably precise features that may be calibrated at any time.

A feature of the present invention is ease in post manufacture field adjustment of critical on chip parameter values without needing adjustable external components.

Other and further features and advantages will be apparent from the following description of presently preferred embodiments of the invention, given for the purpose of disclosure and taken in conjunction with the accompanying drawings.

DETAILED DESCRIPTION OF THE PREFERRED EMBODIMENTS

Figure 1:
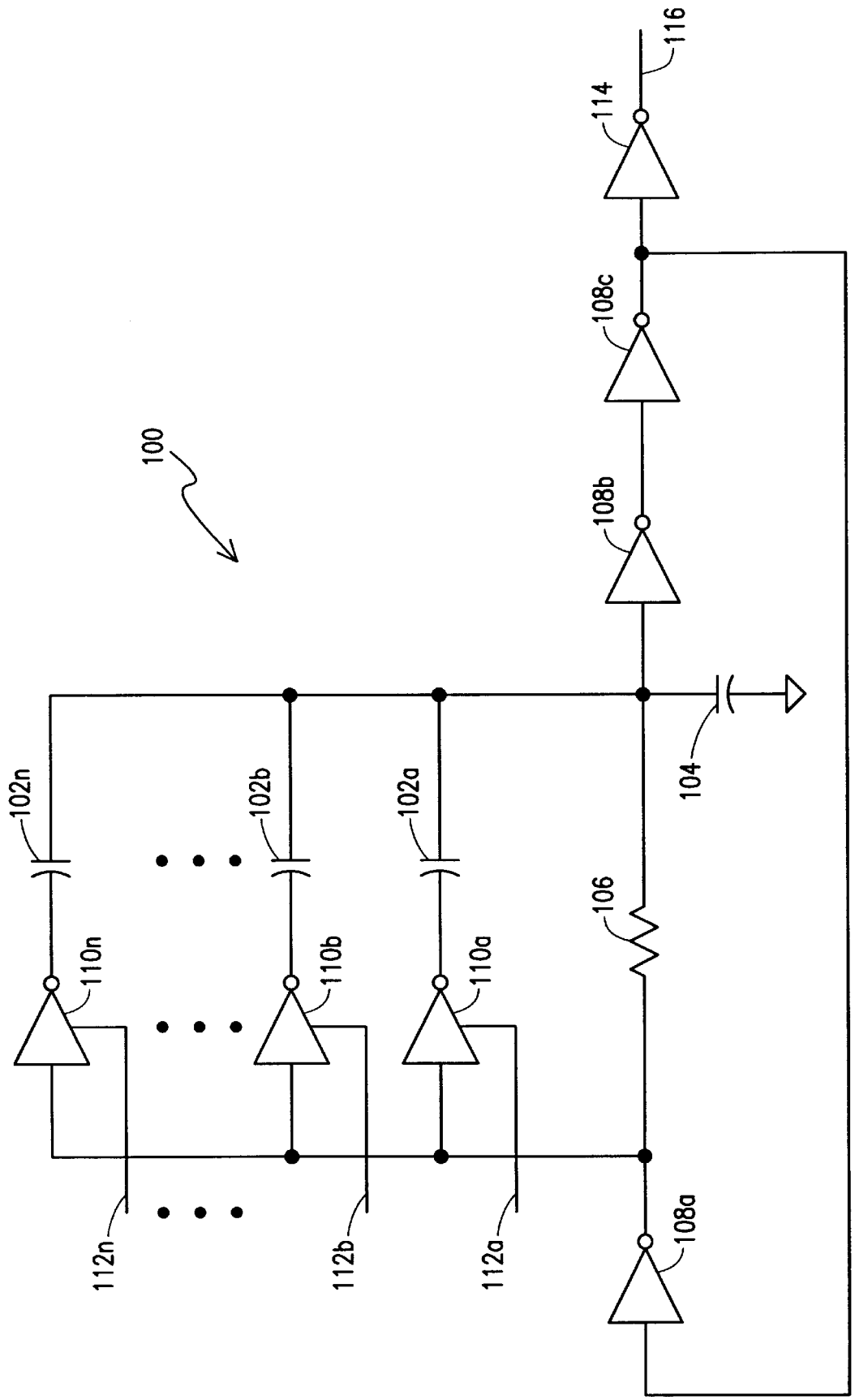
FIG. 1 is a schematic diagram of a clock oscillator function having a plurality of components which are used to adjust its parameter value.

The invention is an integrated circuit comprising a programmable fuse array for storing calibration information associated with adding or removing components so as to calibrate internal functions of the integrated circuit to desired values. In addition, the invention allows the storage of calibration information for the internal functions and/or references after manufacture and assembly of a system utilizing the integrated circuit. Another embodiment of the invention comprises the programmable fuse array on a separate low cost integrated circuit which may be replaced when changes in the calibration parameters are desired without having to replace the more expensive integrated circuit comprising the microcontroller and the internal functions. The most efficient and cost effective use of mask programmable ROM may be utilized with the present invention without affecting its post manufacture capabilities of adjusting critical internal component values of the integrated circuit.

Referring now to the drawings, the details of preferred embodiments of the invention are schematically illustrated. Like elements in the drawings will be represented by like numbers, and similar elements will be represented by like numbers with a different lower case letter suffix.

Referring now to FIG. 1, a schematic diagram of a clock oscillator function having a plurality of components which are used to adjust its parameter value is illustrated. The clock oscillator function is referenced generally by the numeral 100 and comprises timing capacitors 102a, 102b, up to and including 102n, and 104; timing resistor 106, inverting amplifiers 108a, 108b, 108c and 114; and inverting amplifiers 110a, 110b, up to and including 110n having outputs which can be disabled. The clock oscillator function 100 oscillates at a frequency determined by the combination of the timing resistor 106, timing capacitor 104 and the timing capacitors 102a, 102b, up to and including 102n which are connected to the inverting amplifiers 110a, 110b, up to and including 110n which have their outputs enabled. The inverting amplifiers 110a, 110b, up to and including 110n have output enable control inputs 112a, 112b, up to and including 112n, respectively. These output enable control inputs 112 enable or disable the respective amplifier 110 outputs. The amplifiers 110 may have, for example but not limitation, tri-state output, open drain and the like. The output of the clock oscillator function 100 is taken from output 116 of the inverting amplifier 114.

Three timing capacitors 102a, 102b and 102n are shown in FIG. 1 for illustrative clarity, however, it is contemplated and within the scope of the invention to have any number of timing capacitors 102. The values of these timing capacitors 102 may be binary weighted, i.e., 1, 2, 4, 8 . . . $2^{n-1}$. For example, capacitor 102a may be C pf (picoFarads), capacitor 102b may be 2C pf, and capacitor 102n may be $C^{n-1}$ pf. The value of C is determined by the size of the capacitor structure on the integrated circuit and the granularity of adjustments desired for calibration of the function 100.

Figure 2:
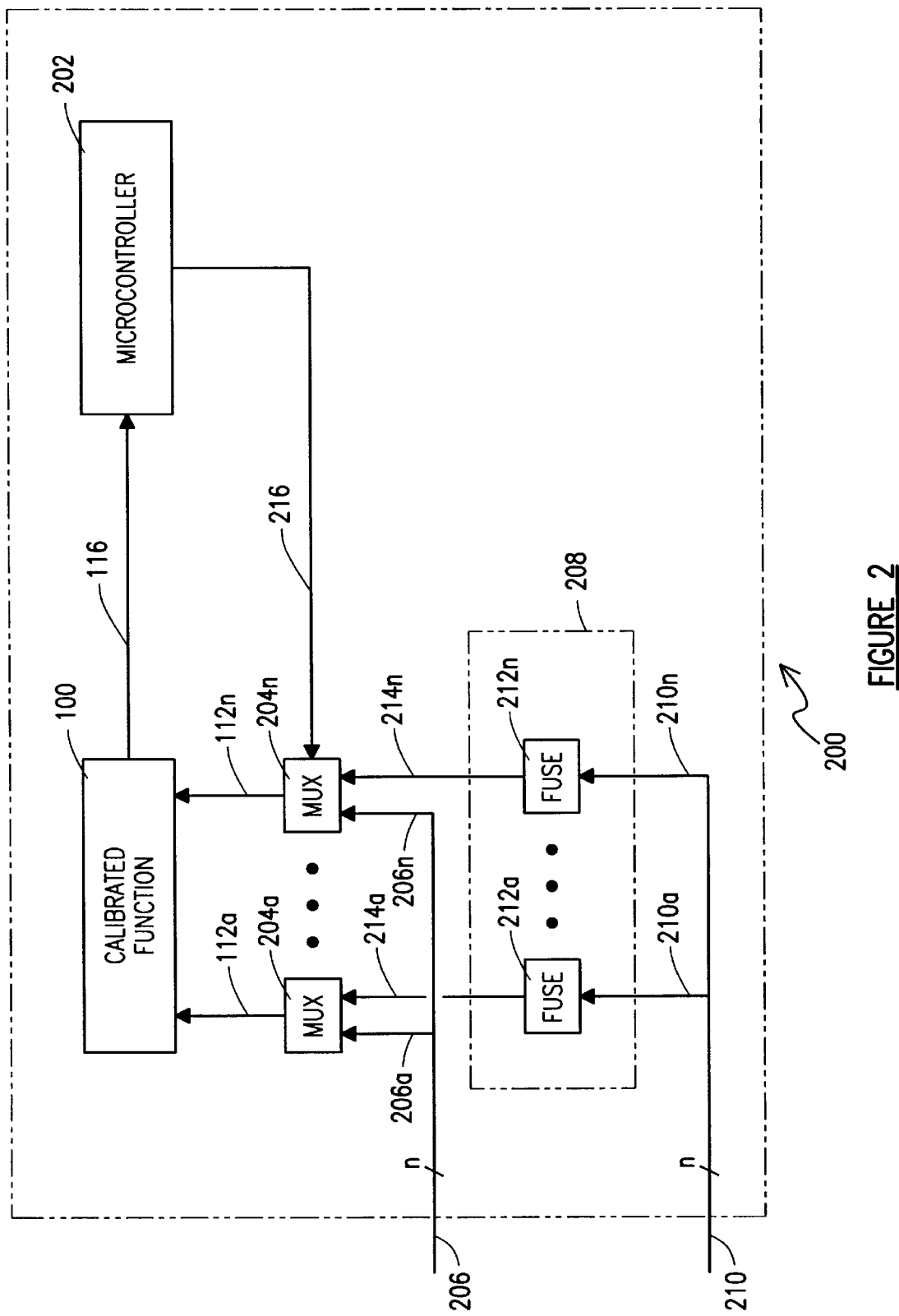
FIG. 2 is a schematic block diagram of an integrated circuit according to an embodiment of the invention.

Referring now to FIG. 2, a schematic block diagram of an integrated circuit, according to an embodiment of the invention, is illustrated. An integrated circuit is generally represented by the numeral 200 and comprises a microcontroller 202, at least one calibrated function 100, a plurality of multiplexers 204 (illustrated as 204a up to and including 204n), and a programmable fuse array 208. The programmable fuse array 208 comprises a plurality of fuses 212 (illustrated as 212a up to and including 212n), a plurality of outputs 214 (illustrated as 214a up to and including 214n) and a plurality of programming inputs 210 (illustrated as 210a up to and including 210n). The each of the plurality of multiplexers 204 (illustrated as 204a up to and including 204n) comprises an output 112 (illustrated as 112a, up to and including 112n), input 206 (illustrated as 206a up to and including 206n) and input 214 (illustrated as 214a up to and including 214n). A multiplexer control 216 from the microcontroller 202 determines which of the inputs 206 or 214 are connected to the multiplexer outputs 112.

The output 116 of the at least one calibrated function 100 is connected to the microprocessor 202 and, in the example illustrated in FIG. 2, is used as a system clock. Other calibrated functions 100 contemplated and within the scope of the invention may be for example but not limitation: analog-to-digital converter, digital-to-analog converter, voltage reference, current reference, timer, amplifier having a calibrated frequency response (high or low pass filter), offset voltage adjustment, bandpass filter (frequency detection), television or radio tuner, temperature transducer amplifier (linear and non-linear temperature profiles), pressure transducer amplifier, analog multiplier and divider, and the like.

The calibrated function 100 may first be calibrated to a desired value by selecting appropriate components of the calibrated function 100. In the example illustrated in FIG. 1, capacitors 102a through 102n are the components which may be selected for a desired clock frequency of the clock oscillator (calibrated function 100). For illustrative purposes, the capacitors 102a through 102n have binary weighted values as described above. An appropriate capacitance value for calibrating the oscillator 100 to a desired frequency may be selected my enabling or disabling the inverting amplifiers 110 through 110n by placing a binary word on the inputs 112a through 112n.

Referring back to FIG. 2, the plurality of multiplexers 204 connect the calibration inputs 206 to the inputs 112 of the calibrated function 100 when a calibrate signal is sent from the microcontroller 202 on the multiplexer control 216. A digital binary word of n bits may be generated from a calibration system (not illustrated) to adjust the number of the capacitors 102 connected to the oscillator circuit illustrated in FIG. 1, depending upon the binary value of the digital word on the inputs 206. Once the desired calibration value for the oscillator frequency is obtained, the respective binary value of the digital word on the inputs 206 is determined. This binary value may now be programmed into the programmable fuse array 208.

The binary value determined above, may be applied to the inputs 210 which may be used to program the fuse links 212 by blowing, for example, each of the fuse links 212 that have a logic 1 corresponding to the binary value. A logic 0 may also be used as the criteria for blowing a fuse link 212 and is contemplated herein.

Figure 3:
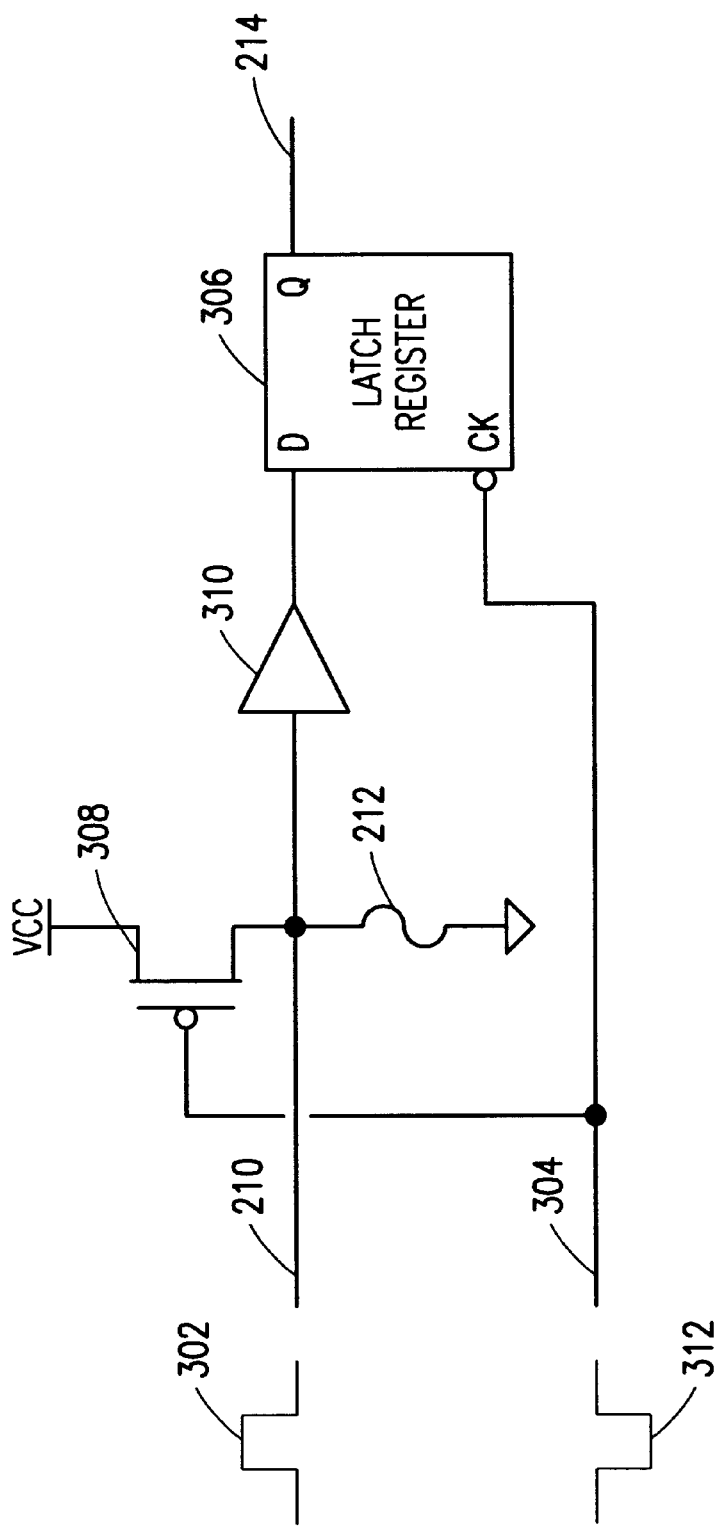
FIG. 3 is a schematic diagram of an embodiment of a portion of the circuit of FIG. 2.

Referring now to FIG. 3, a schematic diagram of an embodiment of a portion of the circuit of FIG. 2 is illustrated. A current pulse 302 may be applied to appropriate inputs 210 so as to blow respective fuses 212. Once these fuses 212 are blown, the calibration information necessary for calibrating the calibrated function 100 is stored therein. A sense amplifier 310, latch register 306 and a pull-up transistor 308 may be used to reduce the current consumed by the programmable fuse array 208. Whenever there is a clock signal on input 304, the logic state of the fuse 212 is determined and stored in the register 306. If the fuse 212 is not blown, the logic state will be sensed as a logic 0, however, if the fuse 212 is blown then pull-up transistor 308 will generate a logic 1 on the input of the sense amplifier 310 whose output is stored in the latch register 306 by a read pulse 312. In this way, lower operating current may be used by the programmable fuse array 208.

Figure 4:
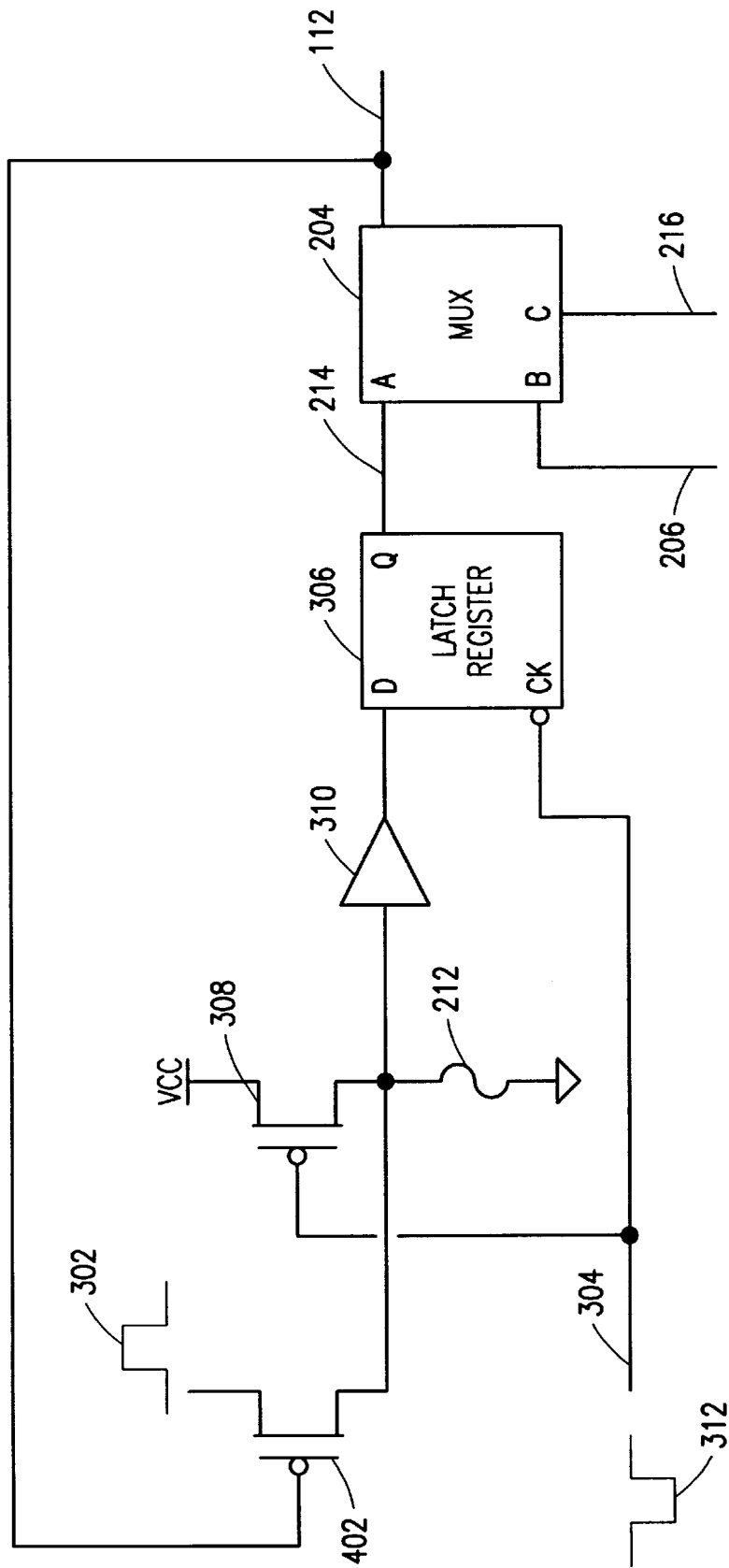
FIG. 4 is a schematic diagram of another embodiment of a portion of the circuit of FIG. 2.

Referring now to FIG. 4, a schematic diagram of another embodiment of a portion of the circuit of FIG. 2 is illustrated. The circuit of FIG. 4 operates in the same fashion as the circuit illustrated in FIG. 3 with the added functionality of being able to program the fuses 212 directly from the calibration binary word on the inputs 112. A transistor 402 turns on when a logic 1 is on the output 112 of the multiplexer 204. The current pulse 302 is applied to the transistor 402 which is also connected to the fuse 212. If the transistor 402 is on (logic 1 at its gate) then the fuse 212 is blown by the current pulse 302. If the transistor 402 is off (logic 0 at its gate) then the fuse 212 is not blown by the current pulse 402. The remainder of the circuitry illustrated in FIG. 4 works the same as described above for the circuitry illustrated in FIG. 3.

Figure 5:
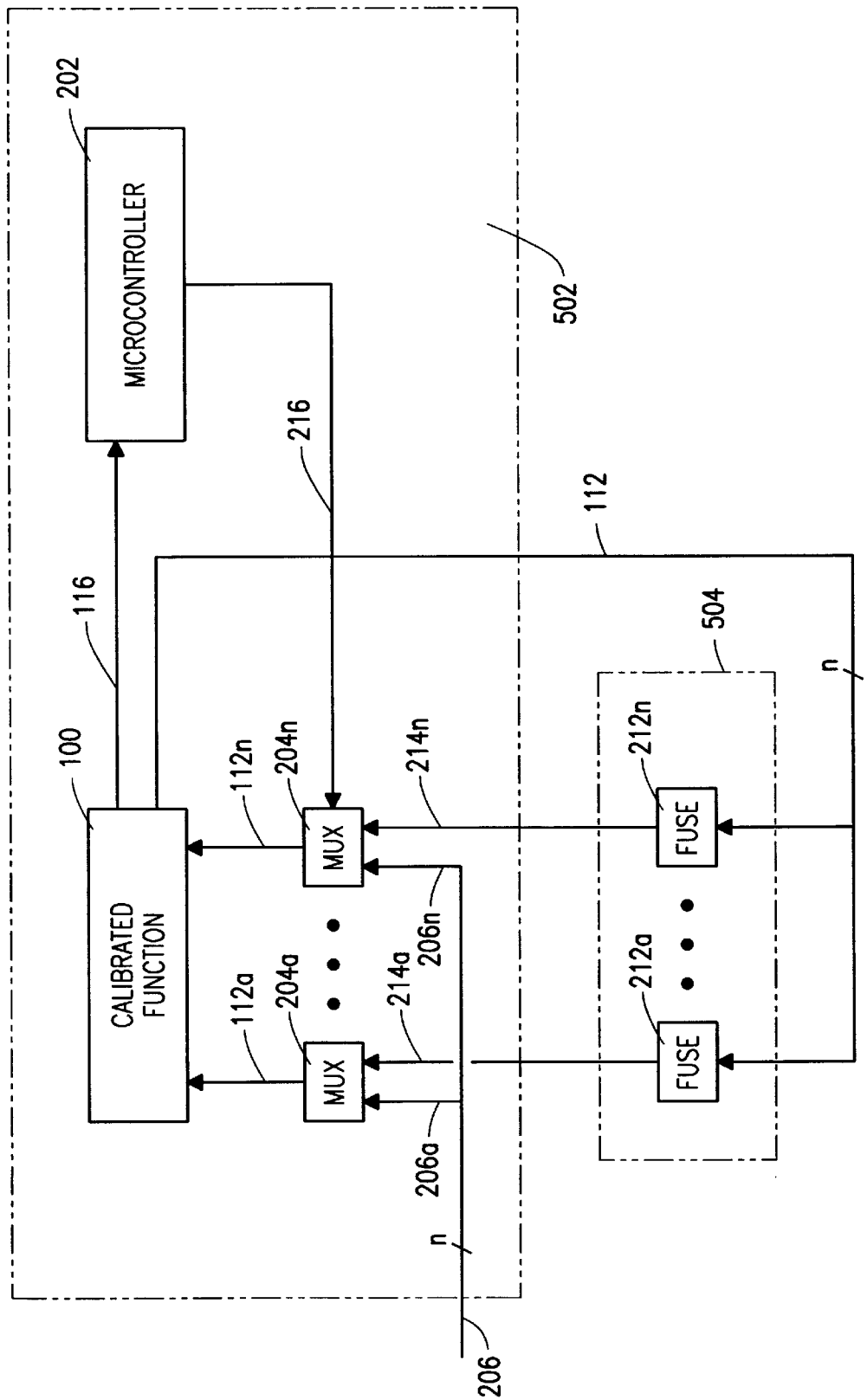
FIG. 5 is a schematic block diagram of another embodiment of the invention.

Referring now to FIG. 5, a schematic block diagram of another embodiment of the invention is illustrated. A programmable fuse array 504 is on a separate integrated circuit than the integrated circuit 502 comprising the microcontroller 202, at least one calibrated function 100, and the multiplexer 204. Having a separate integrated circuit for the programmable fuse array 504 allows a convenient and low cost way of changing the calibration parameters for a new or changing application. The embodiment illustrated in FIG. 5 also is cost effective when the integrated circuit 502 comprises a number of calibrated functions and a complex ROM program for use in a sophisticated application, and the additional circuits required by the programmable fuse array 502 would be more cost effectively implemented on a separate integrated circuit.

The invention, therefore, is well adapted to carry out the objectives and attain the ends and advantages mentioned, as well as others inherent therein. While the invention has been depicted, described, and is defined by reference to particular preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An integrated circuit, comprising:
    a microcontroller;
    a mask programmed read only memory storing instructions which control said microcontroller;

at least one analog function used with said microcontroller;

a plurality of components adapted to control a parameter of said at least one analog function; and a programmable fuse array comprising a plurality of fuse links, at least some of said plurality of fuse links being configured to determine which of said plurality of components controls the parameter of said at least one analog function.

2. The integrated circuit of claim 1, wherein said at least one analog function is an oscillator, said parameter is frequency and said plurality of components are capacitors.

3. The integrated circuit of claim 1, wherein said at least one analog function is an oscillator, said parameter is frequency and said plurality of components are resistors.

4. The integrated circuit of claim 1, wherein said at least one analog function is an oscillator, said parameter is frequency and said plurality of components are current sources.

5. The integrated circuit of claim 1, wherein said at least one analog function is an operational amplifier, said parameter is gain and said plurality of components are feedback resistors.

6. The integrated circuit of claim 1, wherein said at least one analog function is an operational amplifier, said parameter is frequency response and said plurality of components are feedback resistors and capacitors.

7. The integrated circuit of claim 1, wherein said at least one analog function is an operational amplifier, said parameter is input offset and said plurality of components are current sources.

8. The integrated circuit of claim 1, wherein said at least one analog function is an operational amplifier, said parameter is input offset and said plurality of components arc voltage sources.

9. The integrated circuit of claim 1, wherein said at least one analog function is a monostable timer, said parameter is time duration and said plurality of components are resistors.

10. The integrated circuit of claim 1, wherein said at least one analog function is a monostable timer, said parameter is time duration and said plurality of components are capacitors.

11. The integrated circuit of claim 1, wherein said at least one analog function is an analog-to-digital converter, said parameter is input voltage offset and said plurality of components are current sources.

12. The integrated circuit of claim 1, wherein said at least one analog function is an analog-to-digital converter, said parameter is input voltage range and said plurality of components arc voltage references.

13. The integrated circuit of claim 1, wherein said at least one analog function is a digital-to-analog converter, said parameter is output voltage range and said plurality of components are voltage references.

14. The integrated circuit of claim 1, wherein said at least one analog function is a digital-to-analog converter, said parameter is output voltage range and said plurality of components are resistors.

15. The integrated circuit of claim 1, wherein said at least one analog function is a temperature transducer amplifier, said parameter is calibration and said plurality of components are resistors.

16. The integrated circuit of claim 1, wherein said at least one analog function is a pressure transducer amplifier, said parameter is offset and gain and said plurality of components are resistors.

17. The integrated circuit of claim 1, wherein said microcontroller architecture is a complex instruction set.

18. The integrated circuit of claim 1, wherein said microcontroller architecture is a reduced instruction set.

19. The integrated circuit of claim 1, wherein said plurality of components is selected from the group consisting of resistors, capacitors, inductors, voltage sources, current sources, voltage references, current references and transistor sizes.

20. The integrated circuit of claim 1, wherein said parameter is selected from the group consisting of voltage gain, current gain, frequency, frequency response, input voltage offset, output voltage offset, input current offset, output current offset, bandpass center frequency, bandwidth, high pass frequency, low pass frequency, phase shift, time delay, time interval and pulse duty cycle.

21. The integrated circuit of claim 1, wherein said plurality of fuse links are metal fuse links.

22. The integrated circuit of claim 1, wherein said plurality of fuse links are polysilicon fuse links.

23. The integrated circuit of claim 1, further comprising:

a plurality of multiplexers, each of said plurality of multiplexers having an output, first and second inputs, and a control input for selecting the first or second inputs for connection to the output;

the outputs of said plurality of multiplexers being used to determine which of said plurality of components controls the parameter of said at least one analog function;

the first inputs being adapted for connection to a test system which selects which of said plurality of components is used for calibrating said parameter; and the second inputs being connected to said programmable fuse array;

wherein, said parameter is initially calibrated with a test system calibration value when the control input selects the first inputs of said plurality of multiplexers, then the test system calibration value is stored in said programmable fuse array, and the control input selects the second inputs of said plurality of multiplexers so as to maintain the calibration value for said parameter.

24. The integrated circuit of claim 1, further comprising:

a plurality of latch registers connected to said programmable fuse array;

logic for reading the contents of said programmable fuse array and storing the contents in said plurality of latch registers; and outputs of said plurality of latch registers being adapted to determine which of said plurality of components controls the parameter of said at least one analog function.

25. A method of adjusting a parameter of an analog function in an integrated circuit, said method comprising:

adjusting a parameter of an analog function of an integrated circuit to a desired calibration value by selecting components on the integrated circuit which control the parameter of the analog function;

storing a logic pattern representing the selected components in a programmable fuse array comprising a plurality of fuse links; and controlling the selection of the components with the logic pattern stored in the programmable fuse array so as to maintain the desired calibration value of the parameter.

26. The method of claim 25, wherein the step of storing the logic pattern representing the selected components in the programmable fuse array comprises the step of blowing selected ones of the plurality of fuse links.

27. The method of claim 25, further comprising the step of selecting a calibration input from a test system so as to determine the logic pattern to be stored in the programmable fuse array.

28. The method of claim 25, further comprising the step of storing the logic pattern from the programmable fuse array into a latch register so as to conserve power in the integrated circuit.

29. An electronic system having at least one integrated circuit, said system comprising:
   a microcontroller on an integrated circuit;
   a mask programmed read only memory on the integrated circuit, said mask programmed read only memory storing instructions which control said microcontroller;
   at least one analog function on the integrated circuit, said at least one analog function used with said microcontroller;
   a plurality of components on the integrated circuit, said plurality of components adapted to control a parameter of said at least one analog function; and
   a programmable fuse array on the integrated circuit, said programmable fuse array comprising a plurality of fuse links, at least some of said plurality of fuse links being configured to determine which of said plurality of components controls the parameter of said at least one analog function.

30. The electronic system of claim 29, further comprising:
   a plurality of multiplexers, each of said plurality of multiplexers having an output, first and second inputs, and a control input for selecting the first or second inputs for connection to the output;
   the outputs of said plurality of multiplexers being used to determine which of said plurality of components controls the parameter of said at least one analog function;
   the first inputs being adapted for connection to a test system which selects which of said plurality of components is used for calibrating said parameter; and
   the second inputs being connected to said programmable fuse array;
   wherein, said parameter is initially calibrated with a test system calibration value when the control input selects the first inputs of said plurality of multiplexers, then the test system calibration value is stored in said programmable fuse array, and the control input selects the second inputs of said plurality of multiplexers so as to maintain the calibration value for said parameter.

31. The electronic system of claim 29, further comprising:
   a plurality of latch registers connected to said programmable fuse array;
   logic for reading the contents of said programmable fuse array and storing the contents in said plurality of latch resisters; and
   outputs of said plurality of latch registers being adapted to determine which of said plurality of components controls the parameter of said at least one analog function.

32. An electronic system, comprising:
   a microcontroller on a first integrated circuit;
   a mask programmed read only memory on the first integrated circuit, said mask programmed read only memory storing instructions which control said microcontroller;
   at least one analog function on the first integrated circuit, said at least one analog function used with said microcontroller;
   a plurality of components on the first integrated circuit, said plurality of components adapted to control a parameter of said at least one analog function; and
   a programmable fuse array on a second integrated circuit, said programmable fuse array comprising a plurality of fuse links, at least some of said plurality of fuse links being configured to determine which of said plurality of components controls the parameter of said at least one analog function.

* * * * *